United States Patent [19]
Cuomo et al.

[11] Patent Number: 5,225,926
[45] Date of Patent: Jul. 6, 1993

[54] DURABLE OPTICAL ELEMENTS FABRICATED FROM FREE STANDING POLYCRYSTALLINE DIAMOND AND NON-HYDROGENATED AMORPHOUS DIAMOND LIKE CARBON (DLC) THIN FILMS

[75] Inventors: Jerome J. Cuomo, Lincolndale; Charles R. Guarnieri, Somers, both of N.Y.; Bruce A. Hoenig; Hajime Seki, both of San Jose, Calif.; James L. Speidell, Poughquag; Stanley J. Whitehair, Peekskill, both of N.Y.

[73] Assignee: International Business Machines Corporation, Armonk, N.Y.

[21] Appl. No.: 754,861

[22] Filed: Sep. 4, 1991

[51] Int. Cl.$^5$ .......................... G02B 1/10; G02B 5/30; G02B 27/10; G32B 9/00
[52] U.S. Cl. .................... 359/350; 359/486; 359/507; 359/629; 359/896; 428/408; 427/577
[58] Field of Search ............... 359/350, 355, 642, 352, 359/356, 483, 486, 507, 629, 896; 428/408; 427/160, 577

[56] References Cited

U.S. PATENT DOCUMENTS

| | | | |
|---|---|---|---|
| 3,895,313 | 7/1975 | Seitz | 331/94.5 D |
| 3,977,787 | 8/1976 | Fletcher et al. | 356/106 S |
| 4,009,962 | 3/1977 | Lauer | 356/82 |
| 4,320,973 | 3/1982 | Fortunato et al. | 356/346 |
| 4,698,256 | 10/1987 | Giglia et al. | 427/34 |
| 4,744,658 | 5/1988 | Holly | 356/351 |
| 4,809,876 | 3/1989 | Tomaswick et al. | 428/36.6 |
| 4,844,785 | 7/1989 | Kitabatske et al. | 204/192.11 |
| 4,935,303 | 6/1990 | Ikoma et al. | 428/408 |
| 4,940,015 | 7/1990 | Kobashi et al. | 118/723 |
| 4,948,629 | 8/1990 | Hacker et al. | 427/53.1 |
| 4,954,365 | 9/1990 | Neifeld | 427/53.1 |
| 5,006,203 | 4/1991 | Purdes | 156/646 |
| 5,082,359 | 1/1992 | Kirkpatrick | 359/642 |

FOREIGN PATENT DOCUMENTS

| | | |
|---|---|---|
| 0467043 | 4/1992 | European Pat. Off. . |
| 61-155703 | 7/1986 | Japan . |
| 2-45704 | 2/1990 | Japan . |
| 2165265 | 4/1986 | United Kingdom . |

OTHER PUBLICATIONS

Bubenzer, et al "Role of Hard Carbon in the Field of Infrared Coating Materials", *Optical Engineering*, vol. 23, No. 2 Mar. 1984 pp. 153–156.
Windishmann et al "Properties of Diamond Membranes for X-ray Lithography" *Journal of Applied Physics*, vol. 68, No. 11 1 Dec. 1990 pp. 5665–5673.
Southworth et al. *ECO3: Hard Materials in Optics* 14–15 Mar. 1990 The Hague, Netherlands "Optical and other properties of mpacvd diamond" pp. 36–43.

(List continued on next page.)

*Primary Examiner*—Rodney B. Bovernick
*Assistant Examiner*—David R. Parsons
*Attorney, Agent, or Firm*—Robert B. Martin

[57] ABSTRACT

Optical elements, and methods for fabricating them, are described wherein each element includes a free standing (self supporting) polycrystalline continuous thin film of diamond combined with a non-hydrogenated amorphous diamond like carbon (DLC) film having a high percentage of $sp^3$ bonding. These elements may be designed to have optically smooth surfaces, have wide optical transmission ranges (for example, be transparent across the infrared portion of the spectrum), and exhibit exceptional durability characteristics. Optical instruments that include such elements are also described, along with the derivative benefits, such as improved operating performance and lower maintenance requirements, realized using the novel optical elements. In particular, a polarization Michaelson interferometer (PMI) is taught which is operative over the entire range from far infrared into the visible portion of the spectrum without requiring the exchange of beam splitters or beam polarizers. These performance benefits are achieved as a result of the transmission characteristics of the novel optical elements associated with the PMI.

16 Claims, 2 Drawing Sheets

OTHER PUBLICATIONS

Guarnieri, C. Richard et al "Diamond Membranes for X-Ray Lithography", SPIE vol. 1326 Diamond Optics III (1990) pp. 326-330.

Ade, P.AR., et al "Free-Standing Grids Wound from 5 mm Diameter Wire for Spectroscopy at For-Infrared Wavelengths", *Infrared Physics*, vol. 19 (1979) pp. 599-601.

"Electrophoretic Deposition of Nucleating Layers for Polycrystalline Diamond Film Deposition" *IBM Technical Disclosure Bulletin*, vol. 33, No. 10A, Mar. 1991.

Xin, Xiang et al. "Optical properties of chemical-vapor-deposited diamond films" *J. Mater. Res.*, vol. 5, No. 4, Apr. 1990 pp. 811-817.

Cuomo et al. "X-Ray Mask Fabrication" Research Disclosure No. 323, Mar. 1991, Kenneth Mason Publications Ltd.

Cuomo et al., "The Effects of Substrate Conditions on the Microstructural Evolution of Thin Diamond-like films", Meeting of the Materials Research Society, Boston (1990).

Martin et al, "Polarized Interferometric Spectrometry for the Millimeter and Sub-Millimeter Spectrum" *Infrared Physics*, 1969 vol. 10 pp. 105-109.

Lambert et al, "Martin-Puplett Interferometer; an analysis", *Applied Optics* vol. 17, No. 10 15 May 1978 pp. 1595-1601.

Digham et al, "Analysis of a Polarizing Michelson Interferometer for Dual Beam Fourier Transform Infrared, Circular Dichroism Infrared, and Reflectance Ellipsometric Infrared Spectroscopes" *Applied Spectroscopy*, vol. 35, No. 2, 1981.

Cuomo et al, "Ion Beam Deposited Diamond-like films: Synthesis, Properties, and Applications", Workshop on Diamond Thin Films (1990).

Ishida et al, "Polarization-Modulation FT-IR Reflection Spectroscopy Using a Polarizing Michelson Interferometer", *Applied Spectroscopy*, vol. 41, No. 8, (1987) pp. 1288-1294.

Cuomo et al, "Sputter Deposition of Dense Diamond-like Carbon films at low Temperature", *Applied Phys. Lett.* 58(5) 4 Feb. 1991 pp. 1-3.

"IBM's Cuomo Uses Sputtering to Make Amorphous Diamond", Diamond Depositions Science and Technology, Superconductivity Publ., Inc. Mar. (1991).

"Westinghouse Coats Optics with Diamond" Diamond Depositions Science and Technology, Superconductivity, Publ., Inc. Mar. (1991).

DURABLE OPTICAL ELEMENTS FABRICATED FROM FREE STANDING POLYCRYSTALLINE DIAMOND AND NON-HYDROGENATED AMORPHOUS DIAMOND LIKE CARBON (DLC) THIN FILMS

BACKGROUND OF THE INVENTION

1. Field of the Invention

The invention relates generally to optical elements that are fabricated utilizing thin films and to optical instruments that include such elements. More particularly, the invention relates to optical elements that are fabricated utilizing a free standing (self supporting polycrystalline continuous thin film of diamond combined with a non-hydrogenated amorphous diamond like carbon (DLC) film having a high percentage of $sp^3$ bonding.

Optical elements fabricated from the aforementioned combination of materials may be designed to have optically smooth surfaces, have a wide optical transmission range and exhibit exceptional durability characteristics. In turn, optical instruments that are designed to include such elements may realize derivative benefits such as improved operating performance and lower maintenance requirements.

2. Description of the Related Art

A variety of techniques are well known for fabricating electronic and opto-electronic elements on different types of substrates. Such techniques may, for example, involve photolithographically etching metal film, where specially designed masks are used to obtain a desired pattern on the film.

Techniques for creating a specific type of thin film, namely a polycrystalline continuous thin film of diamond, are also well known. For example, a chemical vapor deposition (CVD) technique for depositing diamond films on a substrate is taught by Hacker et al in U.S. Pat. No. 4,948,629.

The known deposition techniques have been refined so that it is now possible to deposit polycrystalline continuous thin films of diamond on specially treated substrates that give a high nucleation density. The resulting films have small grains and smooth surfaces which are particularly well suited for optical applications, such as passing infrared (IR) light. Such teachings are, for example, set forth in an article entitled "Diamond Membrane For X-ray Lithography", by Guarnieri, et al, published in volume 1326 of Diamond Optics III (1990).

Still further examples of improved techniques for the deposition of diamond film, and in particular technique for making films that are well suited for the fabrication of optical elements, are those processes that use electrophoretic deposition of diamond powder onto the substrate. These techniques yield a denser and more uniform deposit then drip or drop methods, and are described, for example, in an article entitled "Electrophoretic Deposition of Nucleating Layers for Polycrystalline Diamond Film Deposition", by Cuomo, et al, appearing in the IBM Technical Disclosure Bulletin, Volume 33, Number 10A, published in March, 1991.

It is now well settled that diamond thin films are ideally suited for a variety of applications, for example, the fabrication of x-ray masks as referred to in the aforementioned Guarnieri, et al article, because of diamond's well known desirable properties of mechanical strength, optical and x-ray transparency, chemical inertness, flatness, rigidity and radiation hardness.

By selecting the proper deposition conditions from those techniques presently available, those skilled in the art are able to obtain films with uniform tension, that combined with both the mechanical and chemical durability of the diamond film, allows the central portion of the film to be etched out resulting in a flat, thin self-supporting diamond membrane framed over a relatively large area. These films, as will be demonstrated hereinafter with reference to the Detailed Description of the invention, may serve as ideal achromatic substrates for optical elements, particularly those that are designed to pass IR light since the IR transmission property of diamond is better than any known material.

The optical properties of self-supporting diamond thin films have been demonstrated to show the expected excellent transmission over a broad range from far infrared into the visible where scattering by the surface roughness begins to cut down on the transmission. Specific reference may be made to an article by Bi et al, entitled "Optical Properties of Chemical-Vapor-Deposited Diamond Films", appearing in the Journal of Material Research, volume 5, published in April 1990 to support these results. By using the techniques described in the aforementioned Guarnieri et al reference to produce films that are smoother than those described by Bi et al, high transmission capability can extend well into the visible range.

Another type of carbon film, well known in the prior art, which has been used for a variety of purposes, including presenting a smooth surface having excellent etching resistance and which can be used as a protective or electrically insulating member for electronic devices, are diamond like carbon (DLC) films such as the one described by Ikoma et al in U.S. Pat. No. 4,935,303. Samples of the Ikoma et al DLC film have a density greater than $1.8 g/cm^3$, up to approximately $2.7 g/cm^3$ (as compared with actual diamond having a density of $3.5 g/cm^3$), and may be produced using a magnetized microwave plasma CVD method where a magnetic field is applied. The hydrogen content of Ikoma et al's DLC is approximately 20%.

Although teaching how to make a hydrogenated DLC film and considering its protective and insulating features for the fabrication of electronic devices, Ikoma et al's teachings did not extend to DLC films that would enhance the durability of optical devices per se. In fact, DLC films that are virtually transparent and would not significantly degrade the performance of optical elements did not exist.

The DLC films having the significantly increased density characteristics and bonding characteristics referred to hereinabove, are described by Angus et al in Paper Number 8.01, published at the International Conference On New Diamond Science and Technology, in September 1990, and by Cuomo et al in a paper entitled "The Effects of Substrate Conditions On the Microstructural Evolution Of Thin Diamond-Like Films", presented at the Fall Meeting of the Materials Research Society, in Boston, Mass., in December 1990.

In these articles, an evolution towards denser films is described as taking place upon increasing beam energy, reducing substrate temperature and increasing substrate thermal conductivity. The higher density film described contain a higher fraction (approximately 80%) of tetrahedrally coordinated ($sp^3$-bonded) carbon; have a density that can approach $3.3 g/cm^3$ (i.e. a density that closely approximates the density of actual diamond); and have a hydrogen content of 5% and 1% when formed using sputter and laser deposition techniques, respectively.

Once again, the newer DLC films, referred to herein as non-hydrogenated amorphous diamond like carbon films, are not to be confused with hydrogenated carbon films (such as the film taught by Ikoma et al in the aforementioned patent), which contain more than 20% hydrogen, are substantially less dense than the non-hydrogenated films (thereby affecting the transmission of closely approximate the density of diamond); but which otherwise exhibit "diamond like" properties.

With the advent of the non-hydrogenated amorphous diamond like carbon film having $sp^3$ fractions approaching diamond, and the refinement of techniques for depositing, high quality diamond films onto substrates that can be etched out to form flat, thin, self-supporting diamond membranes framed over relatively large areas (referred to hereinabove), it would be desirable to provide achromatic substrates and packages formed of the aforementioned materials, for use in fabricating optical elements. Such a combination (the free standing polycrystalline diamond thin film combined with the non-hydrogenated DLC film), would facilitate the fabrication of windows and optical elements that are durable and which have optically smooth surfaces. Such surfaces have heretofore been difficult to achieve without specially treating the substrate surface, etc.(as taught in the aforementioned Guarnieri et al reference), because of the relatively rough surface area presented by the inherently faceted face of diamond film.

Furthermore, it would be desirable to fabricate optical elements that are specifically designed to pass IR light, using diamond film as a substrate and the non-hydrogenated DLC film as a protective coating, since the IR transmission property of diamond, as indicated hereinbefore is better than any known material and would not be appreciably degraded by the DLC coating.

In addition to the desirability of utilizing the aforementioned materials in the fabrication of optical elements in general, and in the fabrication of IR elements in particular, it would be desirable to modify the design of well known optical instruments to incorporate such elements and realize derivative benefits, such as improved operating performance and lower maintenance requirements.

For example, beam splitters are especially important in infrared (IR) Fourier Transform Spectrometers, also known as FTIRs. However, the beam splitters presently used in spectrometers are restricted in the spectral range they can cover partly due to the limited window of transmittance of the substrate material used to support the beam splitting film. Thus, utilizing state of art beam splitters in such applications as FTIRs, requires the use of two, three or more beam splitters in sequence to cover a broad spectral range.

The same limitation applies for beam polarizers. There are far infrared polarizers made from free standing grids wound from very thin wire. Though they are free of substrates the fragility of self-supporting thin wires limit the linear density of the wires and hence are effective only in the long wavelength region, i.e. wavelengths greater than 25 micron.

Modern holographic lithography make possible the preparation of much finer grid dimensions, on the order of 250 nm, which extends the cutoff range of wire grid polarizers beyond the visible. These however require substrates which in most cases add the transmittance range limitations mentioned hereinabove.

Accordingly, it would be desirable, as a further aspect of the invention, to be able to use the aforementioned combination of materials (diamond thin film substrate and non-hydrogenated DLC film), to fabricate optical elements that can be incorporated into redesigned optical instruments, such as Fourier Transform Infrared (FTIR) spectrometers. In particular, it would be desirable to utilize the new combination of materials to fabricate wire grid polarizers and polarizing beam splitters for use in FTIRs and other optical instruments.

A specific desirable application for the invention would be in an FTIR designed around a polarization Michaelson interferometer (PMI), as described in Infrared Physics, by Martin and Puplett (1969), which would enable the PMI to cover the entire range from far infrared into the visible portion of the spectrum without the need of exchanging beam splitters and polarizers as is presently necessary when the PMI is fabricated using state of the art IR optical components.

SUMMARY OF THE INVENTION

Accordingly, it is an object of the invention to provide achromatic substrates and packages formed of free standing polycrystalline diamond thin film combined with amorphous diamond like carbon (DLC) film having $sp^3$ fractions approaching diamond.

It is a further object of the invention to provide optical elements and windows that are durable and which have optically smooth surfaces.

It is still a further object of the invention to provide optical instruments that are designed to incorporate optical elements fabricated in accordance with the teachings of the invention, wherein the new instruments exhibit improved operating characteristics and require less maintenance.

Further yet, it is a specific object of the invention to provide durable wire grid polarizers and polarizing beam splitters, for use in FTIRs and other optical instruments, which are fabricated utilizing the novel combination of a free standing polycrystalline diamond thin film substrate and an amorphous non-hydrogenated high $sp^3$ DLC film. In particular, in accordance with this objective, the invention contemplates utilizing wire grid polarizers and beam splitters fabricated from the aforementioned combination of materials to realize an FTIR designed around a PMI, where the PMI is able to cover the entire range from far infrared into the visible portion of the spectrum without the need of exchanging beam splitters and polarizers.

Accordingly, one aspect of the invention is directed to durable optical elements comprising: (a) a free standing polycrystalline diamond thin film substrate; and (b) an amorphous non-hydrogenated DLC film, having in excess of 50% $sp^3$-bonded carbon, combined with said diamond thin film.

A further aspect of the invention is directed to a method for fabricating durable optical elements comprising the steps of: (a) depositing a polycrystalline diamond thin film on a substrate; (b) removing a portion of said substrate to form a self-supporting polycrystalline diamond thin film membrane; (c) utilizing said membrane to support a wire grid; and (d) protecting said wire grid by depositing a coating of an amorphous non-hydrogenated DLC film, having in excess of 50% sp³-bonded carbon, over said membrane and the wire grid supported thereon.

Yet another aspect of the invention is directed to an FTIR designed around a PMI, where the PMI is able to cover the entire range from far infrared into the visible portion of the spectrum without the need of exchanging beam splitters and polarizers, wherein said PMI comprises: (a) a set of achromatic metal grid polarizers, each of which is formed on a free standing polycrystalline diamond thin film substrate; and (b) means for protecting each of said polarizers which, when deposited on said substrate, forms an optically smooth surface thereon, wherein said means for protecting comprises an amorphous non-hydrogenated DLC film having in excess of 50% sp³-bonded carbon.

The invention features achromatic substrates, windows and packages formed of free standing polycrystalline diamond thin film combined with amorphous diamond like carbon (DLC) film having sp³ fractions approaching diamond. These items, including wire grid polarizers and beam splitters, exhibit unprecedented durability and may be designed with optically smooth surfaces.

Furthermore, the invention features optical instruments that are designed to incorporate optical elements fabricated utilizing the aforementioned combination of materials. These instruments exhibit improved operating characteristics and require less maintenance then similar instruments fabricated utilizing state of the art optical elements.

Further yet, the invention features an FTIR designed around a PMI, where the PMI is able to cover the entire range from far infrared into the visible portion of the spectrum without the need of exchanging beam splitters and polarizers.

These and other objects and features of the invention, and the manner of obtaining them, will become apparent to those skilled in the art, and the invention itself will be best understood by reference to the following detailed description read in conjunction with the accompanying Drawing.

DETAILED DESCRIPTION

As indicated hereinabove, FIGS. 1a–1d illustrate a set of exemplary stages in the process of fabricating the composite optical elements contemplated by the invention.

In particular, the depicted example (in FIG. 1a) shows a diamond thin film 101 deposited on a substrate 102. Any of the aforementioned techniques (such as CVD), may be utilized to deposit the diamond film on the substrate.

Figure 1A:
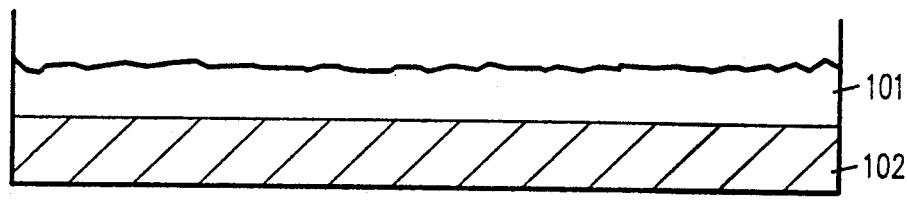
FIGS. 1a–1d illustrate a set of exemplary stages in the process of fabricating the composite optical elements contemplated by the invention. In particular, the depicted example shows a diamond thin film deposited on a substrate (FIG. 1a); a wire grid fabricated on the diamond film (FIG. 1b); a layer of an amorphous non-hydrogenated highly sp³-bonded DLC film applied over the grid and a diamond film/substrate combination, forming a protective optically smooth surface thereover (FIG. 1c); and the completed exemplary package having the central portion of the original substrate etched out to form a transparent window (FIG. 1d).
Figure 1B:
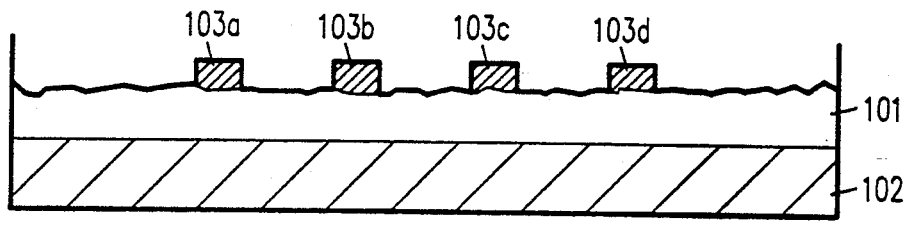

FIG. 1b shows a wire grid that includes grid elements 103a–103d fabricated on the diamond film 101/substrate 102 combination. Polarizers, for example, made from free standing grids wound from very thin wires are well known by those skilled in the art and are taught in many publications including "Infrared Physics", by Ade, et al, published in 1979.

Figure 1C:
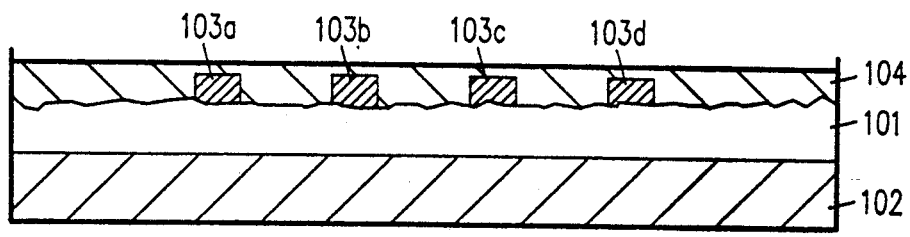

In FIG. 1c, a layer of an amorphous non-hydrogenated highly sp³-bonded DLC film, 104, is shown applied over grid elements 103a–103d and the diamond film 101/substrate 102 combination, forming a protective optically smooth surface thereover. Suitable methods for depositing the DLC film are well known to those skilled in the art and do not constitute a part of the invention per se.

It should be noted, however, that (1) although non-hydrogenated DLC films generally have compressive stress built in and tend to wrinkle when separated from the substrate on which they are deposited, these films, when deposited on a polycrystalline diamond film, tend to smooth the faceted surface; and (2) the built in compressive stress of the DLC film against the built in tensile stress of the diamond film can be compensated for, as is well known in the art, by the proper choice of the film thickness and composites that are used to balance these forces.

Figure 1D:
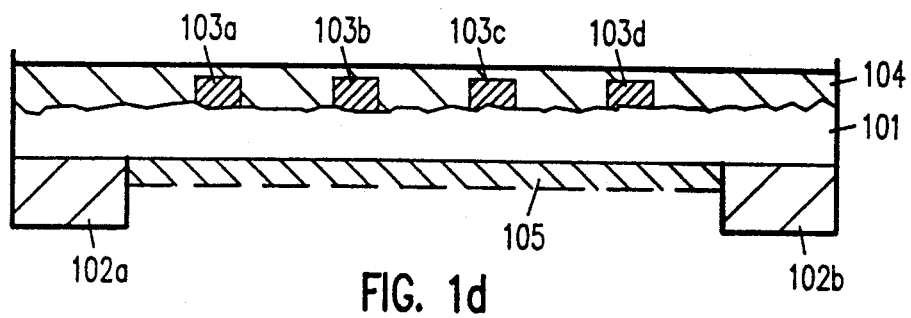

The completed exemplary package, having the central portion of the original substrate etched out (as taught, for example, in the aforementioned Guarnieri, et al reference), leaving substrate portions 102a and 102b in tact (to form a transparent window through the diamond film 101/DLC film 104 combination), is shown in FIG. 1d.

FIG. 1d also depicts an optional layer of DLC film, layer 105, applied on the underside of the window formed by the diamond film 101/DLC film 104 combination, to be used in balancing the aforementioned forces (compressive and tensile stresses), when necessary to prevent the window (the membrane) depicted in FIG. 1d from breaking.

The resultant package shown in FIG. 1d, when the DLC layer(s) include 50% or more of an amorphous non-hydrogenated sp³-bonded DLC film, realizes the objective of achieving an optically smooth, taut, composite membrane, where the diamond like film component may serve as a substrate for achromatic optical elements.

In particular, such elements are particularly well suited for the transmission of IR light based on the transparency characteristics of the diamond film and the amorphous non-hydrogenated sp³-bonded DLC film.

It should also be noted that even though certain optical elements, such as fine wire grid polarizers, are very easily damaged, the technique contemplated by the invention for protecting such elements and their component parts (i.e., depositing the amorphous non-hydrogenated sp³-bonded DLC film over the diamond substrate/component combination), is safe to use since the DLC film may be deposited at low temperature. Thus, for example, the application of a protective overcoat of the amorphous non-hydrogenated sp³-bonded DLC film on the top of the metal grid referred to hereinbefore, will result in a wire grid polarizer of unprecedented durability.

A further aspect of the invention is the use of the achromatic metal grid polarizer on a diamond substrate both as a polarizer and a beam splitter in optical instruments in general, and, in particular, in a polarization Michaelson interferometer (PMI).

Such application has a number of desirable features. For example a PMI using diamond supported metal grid polarizers would be able to cover the entire range from the far infrared into the visible without the need of exchanging beam splitters and polarizers.

PMIs in general, and the PMI contemplated by the invention, are particularly attractive for reflection absorption spectroscopy of very thin films on reflecting substrates in that the difference in the reflection of p- and s-polarized light is obtained directly without the use of a photoelastic polarizer or a mechanically rotating polarizer together with locking amplifiers and all the associated electronics. This is an advantage over taking two similar spectra separately, each signal going through A/D converters, and then taking their difference, which requires larger dynamic range of the A/D. The best spectrometers presently use 15 bit A/Ds which correspond to a noise level of 0.26% which is higher than that of good IR detectors. Since the difference interferogram is measured directly in the PMI the required dynamic range on the A/D is reduced considerably and signal to noise is effectively increased. This advantage is increased for small differences and is effective for the entire range covered by the spectrometer and not just for a limited spectral range.

Figure 2:
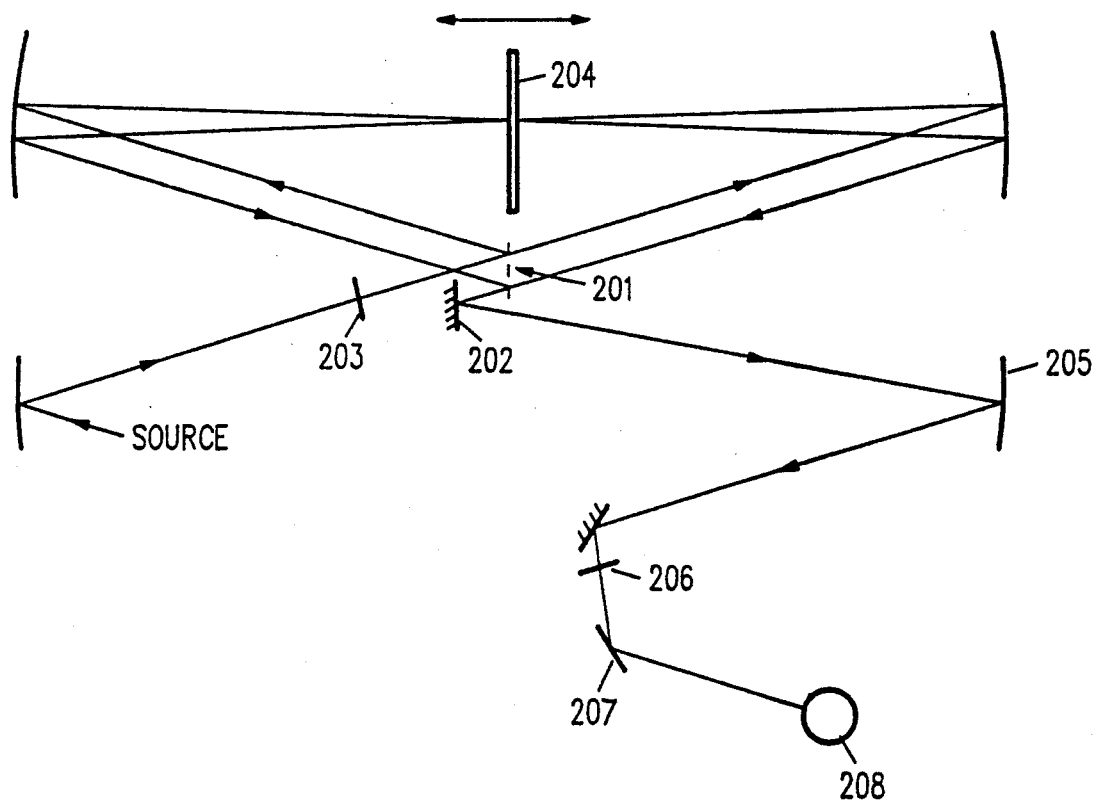
FIG. 2 depicts an FTIR, modified in accordance with the teachings of the invention, to be a polarization Michaelson interferometer (PMI). The novel PMI is able to cover the entire range from far infrared into the visible portion of the spectrum without the need of exchanging beam splitters and polarizers.
Figure 3:
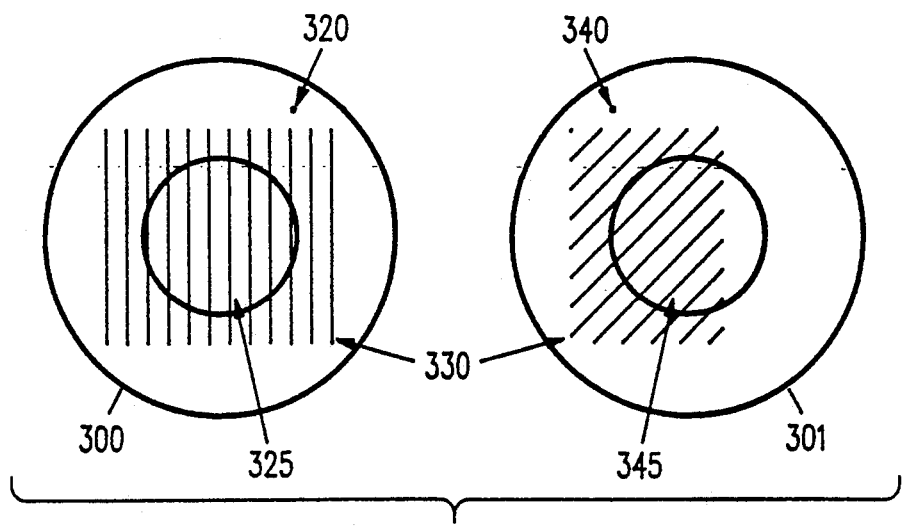
FIG. 3 depicts the pattern and orientation of the polarizers shown in one embodiment of the exemplary PMI of FIG. 2, and also illustrates a preferred structure for wire grid polarizers fabricated in accordance with the teachings of the invention.

To expand on the PMI application per se to support the proposition that the novel optical elements described herein are useful in redesigning many optical instruments, it will be shown, with reference to FIGS. 2 and 3, how an IBM FTIR95 can be modified to be a PMI that includes the polarizers taught herein.

FIG. 2 is the top view of the essential parts of the interferometer section of the FTIR95 as modified in accordance with the teachings of the invention. The instrument is normally supplied with a beam splitter selection wheel so that a different beam splitter can be selected for the various spectral ranges.

According to one aspect of the invention, the existing beam splitter selection wheel in an FTIR95 is replaced by a single metal grid polarizer PBS (polarizing beam splitter), shown in FIG. 2 as 201, and mirror 202.

An additional polarizer, 203, is inserted so the IR beam from the source is polarized before entering the interferometer. The angle of the incident IR beam is shown perturbed slightly so that when the beam returns to PBS 201, after reflection from Scan Mirror (204), it is slightly separated from the point where the beam first encountered PBS 201 and is reflected by mirror 202.

After the second encounter with PBS 201, the beams from the two arms of the interferometer are joined and then reflected by mirror 202 towards focusing mirror 205. The beam then follows the same path as in the original FTIR. There is a second polarizer, 206, which can be inserted (as shown in FIG. 2), for the purposes to be described hereinafter.

Polarizer 203 is oriented so that the transmitted beam is polarized perpendicular to the plane of the interferometer, i.e., the metal grid is parallel to the interferometer plane. PBS 201 is oriented such that the component of the beam polarized +45 degrees from the vertical is transmitted into one arm of the interferometer and the orthogonal component of the beam polarized −45 degrees from the vertical is reflected into the other arm of the interferometer. If the angle of incidence onto PBS 201 is 0 then the metal grid of PBS is tilted by arctan (cos 0) from the plane of the interferometer. (For low angle of incidence the tilt angle is very close to 45 degrees). Polarizer 206 is omitted to obtain the difference interferogram of the s- and p-polarized beams, and inserted either parallel or orthogonally to polarizer 203 to obtain the interferogram of either the s- or p-polarized beam, respectively. The pattern and orientation of the polarizers for this particular example are illustrated schematically in FIG. 3 in which reference numeral 300 represents polarizer 203 of FIG. 2, and reference numeral 301 represents PBS 201 of FIG. 2.

As shown in FIG. 3, the exemplary polarizer 300 includes a substrate portion (e.g., silicon), onto which a thin diamond film has been applied. The central portion of the substrate is shown etched out at 325 to form a transparent window. Wire grid 330 is oriented with the grid parrellel to the interferometer plane, so that the transmitted beam is polarized perpendicular to the plane of the interferometer.

PBS 301 is shown, for the ske of illustration only, having its wire grids oriented at a 44 degree angle, for a 15 degree angle of incidence to PBS 201, to achieve the beam transmissions described hereinabove with reference to the modified IBM FTIR95.

PBS 301 is shown in FIG. 3 to include a substrate having a thin diamond film deposited thereover (for example, silicon substrate plus diamond film combination 340; an etched out transparent window, 345; and wire grid 350 oriented at 45 degrees and only over a portion of window 345.

According to the teachings of the invention, the fragile wire grids fabricated on optical elements 300 and 301 are protected by a coating of an amorphous non-hydrogenated diamond like carbon (DLC) film, having in excess of 50% sp³-bonded carbon.

With the polarizer orientations described above, with reference to FIG. 3, the beam after polarizer 203 is polarized vertically and its two orthogonal components, whose polarizations are tilted 45 degrees from the normal, are separated by PBS 201 into the two arms of the interferometer. After recombining at PBS 201, the beam may be considered to consist of two orthogonal components, one polarized vertically and the other horizontally and their intensities behave as in ordinary FTIRs. However the AC part of the interferograms of the two components are such that they are opposite in sign to each other.

A significant difference between the PMI described hereinabove and the prior art PMIs, is that the prior art PMIs include polarizers, of the type represented by polarizer 203, that are tilted 45 degrees from the interferometer plane. In the novel PMI implementation described hereinabove (and illustrated with reference to FIGS. 2 and 3), such polarizers are vertical. The advantage of this is that the two components of the beam emerging from the interferometer without polarizer 206, are vertically and horizontally polarized, and they will be the s- and p-polarized beam when reflected from a sample surface (shown in FIG. 2 at 207), positioned perpendicular to the plane of the interferometer. If this beam is then focused onto a detector (shown in FIG. 2 as detector 208), the difference of the intensity of the s- and p-polarized reflected light can be measured directly.

A second measurement with polarizer 206 inserted as shown in FIG. 2, yields the spectrum of the s-polarized light only, which can then be used to normalize the difference spectrum.

The FTIR/PMI example set forth hereinabove illustrates that a free standing polycrystalline diamond thin film and an amorphous non-hydrogenated diamond like carbon (DLC) film, having in excess of 50% $sp^3$-bonded carbon, can be used in combination to form achromatic windows and substrates for optical elements, such as the wire grid polarizer and PBS used in the novel PMI.

The combination of materials contemplated by the invention allows the fabrication of windows and optical elements with optically smooth surfaces which is often difficult to achieve with polycrystalline CVD diamond alone.

The amorphous non-hydrogenated diamond like carbon (DLC) film, having in excess of 50% $sp^3$-bonded carbon, can also be applied on top of fragile thin films that are often used in optical elements, to form a layer of protection for the fragile films.

What has been described are optical elements that include a free standing (self-supporting) polycrystalline continuous thin film of diamond combined with a non-hydrogenated amorphous diamond like carbon (DLC) film having $sp^3$ fractions approaching diamond. These elements, together with instruments fabricated therefrom, meet all of the objectives set forth hereinbefore.

Those skilled in the art will recognize that the foregoing description of a preferred embodiment of the novel methods and apparatus has been presented for the purposes of illustration and description only. It is not intended to be exhaustive or to limit the invention to the precise form disclosed, and obviously many modifications and variations are possible in light of the above teaching.

The embodiment and examples set forth herein were presented in order to best explain the principles of the instant invention and its practical application to thereby enable others skilled in the art to best utilize the instant invention in various embodiments and with various modifications as are suited to the particular use contemplated.

It is intended that the scope of the instant invention be defined by the claims appended hereto.

What is claimed is:

1. An optical element comprising:
    (a) a free standing polycrystalline diamond thin film; and
    (b) an amorphous non-hydrogenated diamond like carbon (DLC) film, having in excess of 50% $sp^3$-bonded carbon, combined with said diamond thin film.

2. An optical element as set forth in claim 1 wherein said free standing polycrystalline diamond thin film is an achromatic window and serves as a substrate for at least one optical component.

3. An optical element as set forth in claim 2 wherein said DLC film is combined with said diamond thin film in a deposition process.

4. An optical element as set forth in claim 3 wherein said DLC film is deposited onto said diamond thin film and over any optical component fabricated thereon forming a protective coating for the optical element.

5. An optical element as set forth in claim 4 having, after the deposit of said DLC film, optically smooth surfaces.

6. An optical element as set forth in claim 2 wherein said at least one optical component comprises a wire grid.

7. An optical element as set forth in claim 1 having optically smooth surfaces.

8. An optical element as set forth in claim 1 wherein the combined free standing diamond thin film and DLC film are used as an achromatic window.

9. An optical element as set forth in claim 8 wherein said achromatic window has optically smooth surfaces.

10. An optical element as set forth in claim 1 wherein the combined free standing diamond thin film and DLC film are used as a substrate.

11. An optical element as set forth in claim 10 wherein said substrate has optically smooth surfaces.

12. An optical element as set forth in claim 1 wherein said DLC film is combined with said diamond thin film in a deposition process in which said DLC film is deposited onto said diamond thin film and over any optical component fabricated thereon forming a protective coating for the optical element.

13. Apparatus as set forth in claim 12 wherein the optical element formed after depositing said DLC film has optically smooth surfaces.

14. An infrared transparent material, comprising:
    (a) a free standing polycrystalline diamond thin film; and
    (b) an amorphous non-hydrogenated diamond like carbon (DLC) film, having in excess of 50% $sp^3$-bonded carbon, combined with said diamond thin film to form a material that is transparent over the infrared portion of the spectrum.

15. An optical element comprising:
    (a) a wire grid polarizer fabricated on a diamond thin film substrate; and
    (b) an amorphous non-hydrogenated diamond like carbon (DLC) film, having in excess of 50% $sp^3$-bonded carbon, deposited over said wire grid polarizer and diamond this film substrate for the protection thereof.

16. An optical element comprising:
    (a) a beam splitter fabricated on a diamond thin film substrate; and
    (b) an amorphous non-hydrogenated diamond like carbon (DLC) film having in excess of 50% $sp^3$-bonded carbon, deposited over said beamsplitter and diamond thin film substrate for the protection thereof.

* * * * *